United States Patent
Riou et al.

(10) Patent No.: US 9,526,170 B2
(45) Date of Patent: Dec. 20, 2016

(54) ELECTRONIC MODULE FOR A PIECE OF VEHICLE-BORNE AERONAUTIC EQUIPMENT AND A PIECE OF AERONAUTIC EQUIPMENT FOR AN AERONAUTIC VEHICLE

(71) Applicant: SAGEM DEFENSE SECURITE, Boulogne Billancourt (FR)

(72) Inventors: Jean-Christophe Riou, Boulogne Billancourt (FR); Michel Peyrard, Boulogne Billancourt (FR); Eric Bailly, Boulogne Billancourt (FR)

(73) Assignee: SAGEM DEFENSE SECURITE, Boulogne-Billancourt (FR)

( * ) Notice: Subject to any disclaimer, the term of this patent is extended or adjusted under 35 U.S.C. 154(b) by 243 days.

(21) Appl. No.: 14/400,997

(22) PCT Filed: May 14, 2013

(86) PCT No.: PCT/EP2013/059960
§ 371 (c)(1),
(2) Date: Nov. 13, 2014

(87) PCT Pub. No.: WO2013/171226
PCT Pub. Date: Nov. 21, 2013

(65) Prior Publication Data
US 2015/0173230 A1    Jun. 18, 2015

(30) Foreign Application Priority Data

May 15, 2012   (FR) ..................... 12 54439

(51) Int. Cl.
*H05K 1/09*   (2006.01)
*H05K 1/03*   (2006.01)
(Continued)

(52) U.S. Cl.
CPC .............. *H05K 1/092* (2013.01); *H01L 24/05* (2013.01); *H01L 24/29* (2013.01); *H01L 24/45* (2013.01); *H01L 24/48* (2013.01); *H01L 24/85* (2013.01); *H05K 1/032* (2013.01); *H05K 1/09* (2013.01); *H05K 7/02* (2013.01); *H01L 23/49822* (2013.01); *H01L 23/49827* (2013.01); *H01L 24/73* (2013.01); *H01L 2224/04042* (2013.01);
(Continued)

(58) Field of Classification Search
CPC .......... H05K 1/032; H05K 1/09; H05K 1/092
See application file for complete search history.

(56) References Cited

U.S. PATENT DOCUMENTS 3,749,601 A   7/1973   Tittle
4,946,549 A   8/1990   Bachman et al.
(Continued)

OTHER PUBLICATIONS

J. Freytag et al., "Wire Bonding Technique for High Termperature Applications," 1998 5th International Conference on Solid-State and Integrated Circuit Technology, Oct. 21-23, 1998, pp. 219-221.
(Continued)

*Primary Examiner* — Jeremy C Norris
(74) *Attorney, Agent, or Firm* — Muncy, Geissler, Olds & Lowe, P.C.

(57) ABSTRACT

An electronics module for use at high temperature (up to 225° C.) in onboard aviation equipment, the module having a thick layer hybrid circuit covered in a sealing coating of poly-p-xylylene.

18 Claims, 2 Drawing Sheets

(51) Int. Cl.
*H01L 23/00* (2006.01)
*H05K 7/02* (2006.01)
*H01L 23/498* (2006.01)

(52) U.S. Cl.
CPC ............... *H01L 2224/05556* (2013.01); *H01L 2224/05624* (2013.01); *H01L 2224/32225* (2013.01); *H01L 2224/45144* (2013.01); *H01L 2224/45147* (2013.01); *H01L 2224/45164* (2013.01); *H01L 2224/48091* (2013.01); *H01L 2224/48227* (2013.01); *H01L 2224/48465* (2013.01); *H01L 2224/48624* (2013.01); *H01L 2224/48644* (2013.01); *H01L 2224/48824* (2013.01); *H01L 2224/48844* (2013.01); *H01L 2224/73265* (2013.01); *H01L 2224/85444* (2013.01); *H01L 2924/00011* (2013.01); *H01L 2924/01006* (2013.01); *H01L 2924/01015* (2013.01); *H01L 2924/01047* (2013.01); *H01L 2924/19105* (2013.01); *H01L 2924/30107* (2013.01)

(56) References Cited

U.S. PATENT DOCUMENTS 5,455,195 A 10/1995 Ramsey et al.
2010/0133688 A1 6/2010 Shigihara et al.

OTHER PUBLICATIONS

J.J. Licari, et al., "Hybrid Microcircuit Technology Handbook Materials, Processes, Design, Testing and Production," 2nd Edition, Jan. 1, 1998, pp. 288-294.

P.K. Wu et al., "Surface Reaction and Stability of Parylene N and F Thin Films at Elevated Temperatures," Journal of Electronic Materials, vol. 24, No. 1, 1995, pp. 53-58.

ELECTRONIC MODULE FOR A PIECE OF VEHICLE-BORNE AERONAUTIC EQUIPMENT AND A PIECE OF AERONAUTIC EQUIPMENT FOR AN AERONAUTIC VEHICLE

BACKGROUND OF THE INVENTION

Field of the Invention

The present invention relates to an electronic module for onboard aviation equipment, and to equipment for an aviation vehicle such as an aircraft.

Brief Discussion of the Related Art

It is known that aircraft and aircraft equipment are subjected in operation to mechanical and thermal stresses that together severely test the structures of said aircraft and of their equipment. Those stresses apply in full or in part both during flight proper and during stages of takeoff, landing, braking or taxiing on the ground, and in a variety of environments depending on the geographical regions in which the aircraft are used. This leads to stresses of large amplitude making it difficult to design aircraft and aircraft equipment.

By way of example, in the vicinity of an aircraft wheel the thermal amplitudes under consideration extend from −60° C. (for several hours in flight) to a value that under some circumstances may be as high as +180° C., or even 4-200° C. on landing (with the high temperature lasting for at least about one hour) because of the temperature rise in the wheel brakes, and this applies for thousands of cycles. In addition to temperature, there are also impacts and vibration on landing that can lead to mechanical damage to equipment.

Electronics modules and circuits are particularly sensitive to such stresses. In particular:

temperature variations give rise to expansion and contraction cycles for circuit components;

high temperature exposure that is prolonged (in terms of accumulated duration) causes intermetallic compounds to be generated between the materials present, thereby weakening assemblies and possibly leading to sudden breaks in the event of impacts or during thermal cycling; and at low temperatures rigid materials may be found to be weak in the event of impacts (ductile/brittle transitions).

In addition, when such components are made of different materials, as is usually the case, differential expansions and contractions appear that lead to stresses in heterogeneous assemblies and components.

Certain circuits are embedded in plastics material such as an epoxy resin in order to protect them from moisture. Given the thickness of epoxy needed for such a protection function, the differential expansions may be such as to break connections between the epoxy and the circuit, thereby letting moisture in or leading to high levels of stress on the connections between surface components and the circuit.

There also exist modules comprising circuits enclosed in hermetic packages containing inert gas or a vacuum. That serves to reduce problems of differential expansions and of general aging, but considerably increases the weight, the size, the complexity, and thus the cost of such modules, while also making the necessary inspection operations more complicated.

SUMMARY OF THE INVENTION

An object of the present invention is to provide means for limiting the influence of temperature variations, and more particularly differential expansions, on electronic modules that are for aviation applications.

To this end, the invention provides an electronics module for onboard aviation equipment, the module comprising a thick layer hybrid circuit covered in a sealing coating of polyp-xylylene.

Poly-p-xylylene is deposited by chemical vapor deposition (CVD) under a vacuum and it possesses properties enabling the sealing coating to perform its function even when it is of very small thickness. Because of this small thickness, the effects induced by differential expansions are very limited and do not lead to stresses that are sufficient to break the connections of surface-mounted components with the circuit or to lead to moisture penetrating into the interface between the circuit and the coating. On the contrary, this material enables the lifetime of wiring to be lengthened, in particular of wiring using wire bonds.

Temperature variations might also lead to breaks of electrical and mechanical connections with the conductor elements of the circuit. It has been found that such breaks occur more particularly when the atoms of a metal of one of the conductive elements of the circuit diffuse into the metal of another conductive element of the circuit so that the atoms of those metals combine to form an intermetallic compound of weaker mechanical strength. This happens particularly frequently with gold, aluminum, and tin since they possess physicochemical characteristics (redox potential, crystal structure, diffusion rate, amongst others) that are likely to accelerate these phenomena.

Preferably, the circuit comprises at least a first conductive element, and a second conductive element, the first element including at least a first metal optionally different from a second metal of the second element and being electrically and mechanically connected to the second conductive element by a connection in such a manner as to oppose diffusion of the first metal into the second metal.

This limits the formation of intermetallic compounds that might degrade the electrical resistance and the mechanical strength of the connection between conductive elements.

In a first embodiment, the metals are selected to have atomic weights that are sufficiently high and/or electronegativity coefficients that are sufficiently close together to limit the diffusion of one of the metals into the other.

The diffusion of one of the metals into the other takes place more quickly when that one of the metals is of small atomic weight and when the metals have electronegativity coefficients that are far apart from each other. An appropriate choice of metals makes it possible to act on one or both of these parameters to slow down the diffusion of the metal.

In a second embodiment, the first element includes a third metal for co-operating with the second metal at the connection to form a metallic barrier opposing migration of the first metal to the second metal.

This encourages the creation of an intermetallic compound of mechanical strength that is greater than that of the intermetallic compound that would otherwise be formed by the first metal and the second metal. The favored intermetallic compound establishes a metallurgical barrier opposing migration of the first metal.

Preferably, the coating has a total thickness lying in the range 8 micrometers (μm) to 20 μm, and advantageously, the coating has a total thickness lying in the range 10 μm to 15 μm, approximately.

This thickness is optimal for:

firstly limiting stresses; and secondly preventing electromigration of an underlying material (e.g. silver) when the module is subjected to moisture, possibly in the presence of sulfur.

Also advantageously, the module includes at least one component fastened by adhesive on a support, the adhesive having a free portion that is disengaged from the support and the component and that is completely covered in the protective coating.

The coating protects the adhesive from moisture (which might lead to destruction of chemical bonds within the adhesive and/or at the interface between the adhesive and the bonded-together part), thereby improving the thermo-mechanical strength of the adhesive bonding.

The invention also provides aviation equipment including the electronics module of the invention.

Other characteristics and advantages of the invention appear on reading the following description of particular, non limiting embodiments of the invention.

BRIEF DESCRIPTION OF THE DRAWINGS

Reference is made to the accompanying drawings, in which.

DETAILED DESCRIPTION OF THE PREFERRED EMBODIMENTS

Figure 1:
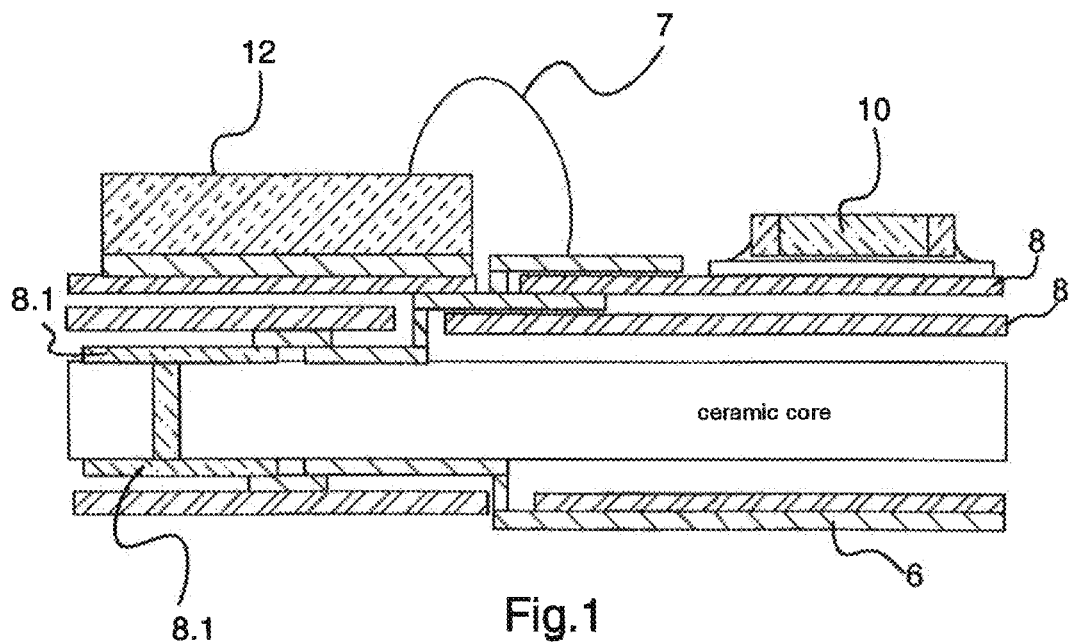
FIG. 1 is a fragmentary diagrammatic view in section showing the various assemblies present on an aviation electronics module in accordance with the invention.

With reference to the figures, the invention is described in application to equipment for an aircraft, however it may be applied to any other electronics module that needs to operate over extreme temperature ranges that may extend from about −60° C. to about +225° C.

The electronics module of the invention comprises a ceramic hybrid circuit 6 covered in a sealing coating 7 of poly-p-xylylene. The poly-p-xylylene used may for example be that sold under the trademark "Parylene". Poly-p-xylylene is deposited by CVD under pressure so as to cover the entire circuit 6 with the exception of terminals for connecting the circuit 6 to the system on which it is mounted. The sealing coating 7 is of very small thickness (in this example less than 30 μm). Preferably, the thickness of the coating 7 lies in the range 8 μm to 20 μm, and advantageously in the range 10 μm to 15 μm.

In known manner, the circuit 6 has a ceramic core made up of superposed conductive layers alternating with electrically insulating layers, and possibly also resistive layers. The conductive layers 8 define tracks and passive components (resistors, inductors, . . . ) and they are formed using a conductive ink. The conductive layers have portions 8.1 that are connected together by plated-through holes, portions 8.2 (more particularly outer layers of the circuit 6) connected to connection wires 9 by wire bonding, portions 8.3 (more particularly outer layers of the circuit 6) connected to components 10 by solder 11. Components 12 fastened to the circuit 6 also have pads 13 connected to connection wires 9 by wire bonding.

In the invention, when a first conductive element needs to be electrically and mechanically connected to a second conductive element, and when the first element includes at least a first metal that is different from a second metal of the second element, provision is made to select the metals and to make the connection in such a manner as to oppose the first metal diffusing into the second metal. More precisely, in two embodiments:

the metals are selected to have atomic weights that are sufficiently high and/or electronegativity coefficients that are sufficiently similar to limit the diffusion of one of the metals into the other; or the first element includes a third metal to act together with the second metal at the connection to form a double metallic barrier opposing migration of the first metal into the second metal, or vice versa.

In the present example, this gives rise to the following:

the tracks are made for example of palladium-doped gold with a palladium content greater than or equal to 1%;

the connection wires 9 are made for example of palladium-doped gold with a palladium content greater than or equal to 1%;

the pads 14 of the component 10 are provided with a tin-based finish on a nickel barrier and the pads 13 of the component 12 are made of aluminum alloy; and the soldering 11 is performed for example with high melting point (HMP) solder comprising in particular a majority of lead, silver, and a small content of tin. This solder may also include indium taking the place of some or all of the tin.

Figure 2:
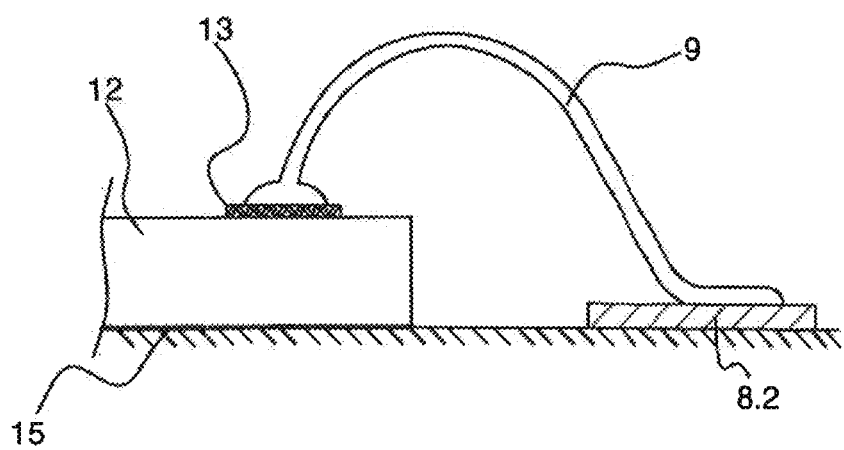
FIG. 2 is a fragmentary diagrammatic view in section of a connection made by wire bonding a chip.

Concerning the connection by wire bonding, the connection wires 9 to the portions 8.2 of the conductive tracks 8, this is done by "wire bonding" (i.e. electric welding), see FIG. 2, the metals used being such that there is no diffusion of gold nor is there any formation of a harmful intermetallic compound.

For wire bonding the connection wires 9 to the pads 13 (see also FIG. 2), the palladium of the connection wires 9 combines with the aluminum of the pad 13 in order to form a metallurgical barrier that opposes the diffusion of gold into the aluminum. The copper finishing the pads 13 adds to this barrier (double metallurgical barrier) and prevents the gold from diffusing into the aluminum. The metallurgical barrier as created in this way slows down the diffusion of gold or indeed blocks it. The intermetallic compound forming the barrier grows more slowly than the compound which would be formed between aluminum and gold, thereby increasing the lifetime of the wire bonding by limiting variation in its metallurgical structure.

Figure 3:
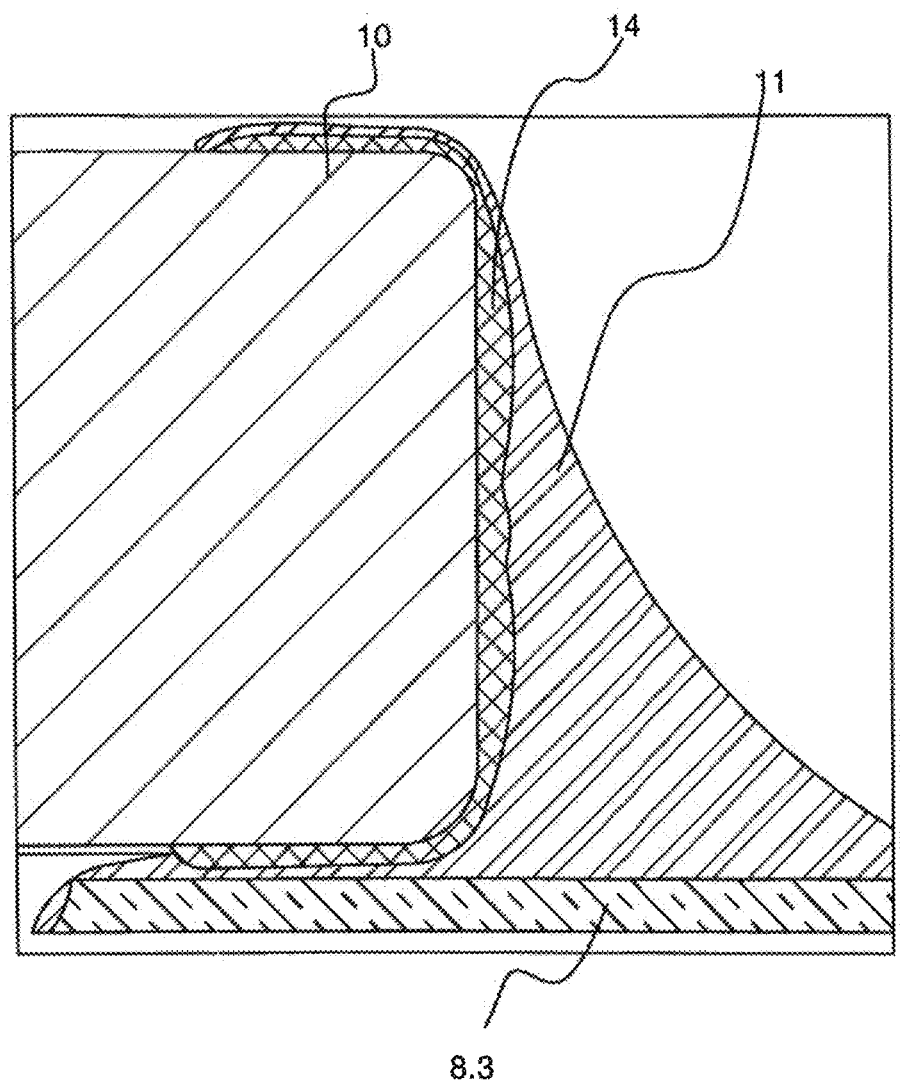
FIG. 3 is a detail view in section of the connection between a passive component and the circuit.

For the connections of the portions 8.3 to component pads 10 by soldering 11 (FIG. 3), two phenomena need to be taken into consideration respectively at the interface between the solder 11 and the track portion 8.3 and at the interface between the solder 11 and the pad 14 of the component 10. In the interface zone between the solder 11 and the portion 8.3, the palladium and the platinum of the track combine with the tin (or the indium) of the solder 11 to form a double metallurgical barrier opposing the migration of the gold into the tin, and thus opposing the gold becoming dissolved in the tin (eliminating defects of the "Kirkendall void" type). In the interface zone between the solder 11 and the pad 14 of the component. 10, the tin forms an intermetallic compound with the finishing nickel that, because of its electronegative characteristics and the size of its atomic lattice, slows down considerably the formation of intermetallic compounds at high temperatures. It should be observed that the use of a solder having a low tin content reduces the availability of tin for dissolving gold or nickel.

In a less expensive variant, the conductive layers 8 are made of silver or of silver alloy and the outer portions 8.2 and 8.3 are covered in a coating that results from successively depositing nickel, palladium, and gold; or of nickel and gold; and/or connection wires 9 that might contain copper, gold, and palladium.

Under such circumstances, since copper has atoms of relatively large size and presents an electronegativity coefficient, that is not too remote from that of nickel, copper atoms diffuse little into the nickel and create few or no voids. The phenomenon is identical with respect to the aluminum of the pads of ICs and the wire containing copper, gold, and palladium. This variant thus makes it possible for wiring to be reliable at high temperature involving finishes of aluminum and aluminum alloys, and components having finishes including nickel, gold, and copper.

Furthermore, substrate finishes made of nickel/palladium/gold or of nickel/gold are also suitable for high temperature soldering of the kind described above in the present document.

Naturally, the invention is not limited to the embodiments described but covers any variant coming within the ambit of the invention, as defined by the claims.

In particular, the module may include components that are adhesively bonded, e.g. by means of a high temperature silicone adhesive or by means of a high temperature polyimide or epoxy adhesive. Under such circumstances, specifically:

the components 10 have a finish 14 comprising alloyed silver or alloyed gold; and the components 12 have finish 13 or 15 compressing silicon, or silver, or gold, that may optionally be alloyed.

The module of the invention may be of a structure that is different from that described and may be applied to any type of equipment, hardware, or device on board an aircraft.

The invention claimed is:

1. An electronics module for onboard aviation equipment designed to operate at a maximum temperature of about +225° C., the module including a ceramic hybrid circuit covered in a protective coating of poly-p-xylylene, the circuit comprising at least a first conductive element and a second conductive element, the first element including at least a first metal different from a second metal of the second element and being electrically and mechanically connected to the second conductive element by a connection in such a manner as to oppose diffusion of the first metal into the second metal, and the first element including a third metal for co-operating with the second metal at the connection to form a metallurgical barrier opposing migration of the first metal to the second metal, the second element being a track of silver covered in a coating superposing in succession nickel, palladium, and gold, or a coating superposing in succession nickel and gold.

2. The module according to claim 1, wherein the first element is a palladium-doped gold wire welded on the second element.

3. The module according to claim 1, wherein the first element is a copper wire wire bonded on the second element.

4. The module according to claim 1, wherein the coating has a total thickness that is less than or equal to about 15 µm.

5. The module according to claim 1, wherein the hybrid circuit includes an aluminum core supporting superposed conductive layers having portions that are connected together by plated-through holes.

6. The aircraft equipment including an electronics module according to claim 1.

7. The use of an electronics module in onboard aviation equipment that is subjected to temperature variations lying in the range appropriately −60° C. to +225° C., the module including a ceramic hybrid circuit covered in a poly-p-xylylene protective coating, the circuit comprising at least a first conductive element and a second conductive element, the first conductive element including at least a first metal different from a second metal of the second element and being electrically and mechanically connected to the second conductive element via a connection in such a manner as to oppose diffusion of the first metal into the second metal, and the first element including a third metal to co-operate with the second metal at the connection to form a metallurgical barrier opposing migration of the first metal to the second metal.

8. The use according to claim 7, wherein the metals are selected to have atomic weights that are sufficiently high and/or electronegativity coefficients that are sufficiently close to limit diffusion of one of the metals into the other.

9. The use according to claim 7, wherein the first element is a palladium-doped gold wire wire bonded on the second element.

10. The use according to claim 7, wherein the first element is a copper wire bonded on the second element.

11. The use according to claim 7, wherein the second element is an aluminum-doped pad.

12. The use according to claim 7, wherein the second element is a silver track covered in a coating comprising superposing in succession nickel, palladium, and gold, or a coating comprising superposing in succession nickel and gold.

13. The use according to claim 7, wherein the second element is a palladium-doped gold track.

14. The use according to claim 13, wherein the palladium content is at least 1%.

15. The use according to claim 7, wherein the first metal is alloyed gold and the second element is solder comprising either a majority of lead, tin, and silver, or else a majority of lead, indium, and silver.

16. The use according to claim 15, wherein the first element is a silver track covered in a coating comprising superposing in succession nickel, palladium, and gold, or a superposing coating comprising in succession nickel and gold.

17. The use according to claim 7, wherein the coating has a total thickness that is less than or equal to about 15 µm.

18. The use according to claim 7, wherein the hybrid circuit includes an aluminum core supporting superposed conductive layers having portions connected together via plated-through holes.

* * * * *